US006916401B2

(12) United States Patent
Long (10) Patent No.: US 6,916,401 B2
(45) Date of Patent: Jul. 12, 2005

(54) ADJUSTABLE SEGMENTED ELECTRODE APPARATUS AND METHOD (75) Inventor: Maolin Long, Guangzhou (CN)

(73) Assignee: Tokyo Electron Limited, Tokyo (JP)

( * ) Notice: Subject to any disclaimer, the term of this patent is extended or adjusted under 35 U.S.C. 154(b) by 287 days.

(21) Appl. No.: 10/339,597

(22) Filed: Jan. 10, 2003

(65) Prior Publication Data

US 2003/0103877 A1 Jun. 5, 2003

Related U.S. Application Data (63) Continuation of application No. PCT/US01/41311, filed on Jul. 10, 2001.
(60) Provisional application No. 60/218,040, filed on Jul. 13, 2000.

(51) Int. Cl.[7] .......................... C23F 1/00; H01L 21/306
(52) U.S. Cl. .......................... 156/345.43; 156/345.47; 118/723 E
(58) Field of Search .................. 156/345.43, 345.47; 118/723 E; 216/71; 438/710; 427/569

(56) References Cited

U.S. PATENT DOCUMENTS

| | | | |
|---|---|---|---|
| 4,885,074 A | | 12/1989 | Susko et al. |
| 5,565,074 A | | 10/1996 | Qian et al. |
| 5,652,029 A | * | 7/1997 | Itoh .......................... 427/569 |
| 5,733,511 A | | 3/1998 | De Francesco |
| 5,914,568 A | * | 6/1999 | Nonaka .................. 315/111.21 |
| 2002/0170676 A1 | * | 11/2002 | Mitrovic et al. ........ 156/345.47 |
| 2003/0079983 A1 | * | 5/2003 | Long et al. .................. 204/164 |

FOREIGN PATENT DOCUMENTS

| | | | | |
|---|---|---|---|---|
| JP | | 57023227 | 6/1982 | |
| JP | | 60012734 | 1/1985 | |
| JP | | 01108382 | 4/1989 | |
| JP | | 02011781 | 1/1990 | |
| JP | | 03044028 | 2/1991 | |
| JP | | 2002359232 A | * 12/2002 | ....... H01L/21/3065 |

OTHER PUBLICATIONS

U.S. Appl. No. 10/189,425, filed Jul. 8, 2002, Mitrovic.

* cited by examiner

Primary Examiner—P. Hassanzadeh
Assistant Examiner—Maureen G. Arancibia
(74) Attorney, Agent, or Firm—Pillsbury Winthrop Shaw Pittman LLP (57) ABSTRACT

A segmented electrode apparatus for use in plasma processing in a plasma chamber or as part of a plasma processing system. The apparatus is composed of a plurality of electrode segments each having an upper surface, a lower surface and a periphery. The lower surfaces of the electrode segments define an electrode segment plane. Further included in the electrode is a plurality of displaceable insulating ring assemblies with a conductive shielding layer in each of them. Each assembly has an insulating body with an upper and lower portion and surrounds a corresponding one of the electrode segments at the electrode segment periphery. Each insulating ring assembly is arranged adjacent another insulating ring assembly and is displaceable with respect thereto and to the corresponding electrode segment. Also included in the electrode apparatus is a plurality of displacement actuators connected to the chamber and to the plurality of insulating ring assemblies at the insulating body upper portions. The displacement actuators are used to displace at least one of the insulating ring assemblies relative to the corresponding one of the electrode segments so as to cause the lower portion of at least one insulating body to move in a direction perpendicular to the electrode segment plane.

30 Claims, 4 Drawing Sheets

ADJUSTABLE SEGMENTED ELECTRODE APPARATUS AND METHOD

This a Continuation of International Application No. PCT/US01/41311, which was filed on Jul. 10, 2001 and claims priority from Provisional U.S. application Ser. No. 60/218,040, which was filed Jul. 13, 2000, the contents of both of which are incorporated in their entirety herein.

BACKGROUND OF THE INVENTION

The present invention pertains to electrodes, and in particular to adjustable segmented electrodes used in plasma processing of workpieces such as semiconductor wafers.

In semiconductor manufacturing, plasma reactor chambers are used to remove or deposit material on a workpiece (e.g., semiconductor substrate) in the process of making integrated circuit (IC) devices. A key factor in obtaining the highest yield and overall quality of ICs is the uniformity of the etching and deposition processes.

A problem that has plagued prior art plasma reactors is the control of the plasma to obtain uniform workpiece etching and deposition. In plasma reactors, the degree of etch or deposition uniformity is determined by the uniformity of the plasma properties. The latter is dictated by the design of the overall system, and in particular the design of the electrodes used to create the plasma in the interior of the reactor chamber.

Figure 1:
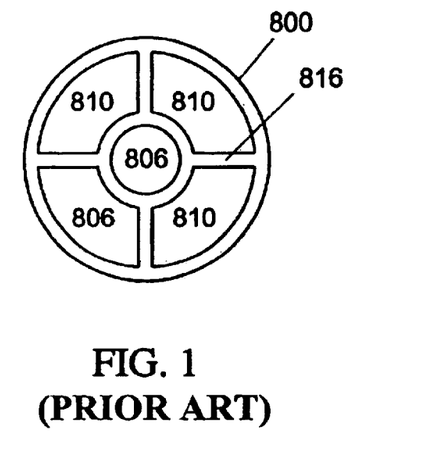
FIG. 1 is a plan view of a prior art segmented electrode showing the electrode segments with the insulating structure between the segments.

One approach to improving etch and deposition uniformity has been to use a segmented electrode. FIG. 1 is a plan view of one type of prior art segmented electrode 800. Electrode 800 is circular in shape and comprises a central electrode segment 806, and four arcuate-shaped outer electrode segments 810 surrounding the central electrode segment. Electrode segments 806 and 810 are made of a conducting material, such as aluminum or aluminum covered with silicon on the front surface facing the plasma. Each electrode segment 806 or 810 is electrically connected to a RF power supply (not shown) that provides power to the electrode segment. Though nominally identical, the RF signal being applied to one electrode segment is likely to differ from that being applied to adjacent electrode segments in power (voltage or current or both at the same time), frequency, phase, or even waveform. Even the phase difference in RF between adjacent sub-electrodes (i.e., electrode segments) can be sufficient to cause electrical discharging between electrode segments when the dielectric separation between them is small.

Accordingly an insulating structure 816 supports and separates respective electrode segments 806 and 810 to prevent electrical communication (e.g., discharging) between the segments when RF power is supplied to the segments. Insulating structure 816 is typically non-adjustable and made of a ceramic material or glass.

Unfortunately, even with a segmented electrode such as electrode 800 of FIG. 1, etch and deposition non-uniformities can occur when processing a workpiece. In particular, when plasma etching a substrate with a segmented electrode, it is expected that regions underneath the insulating structure 816 have a different etch or deposition rate than regions directly underneath the sub-electrodes. The overall non-uniformity is typically-up to 10% for a 200 mm capacitively coupled plasma chamber with an unsegmented plasma electrode. A successful implementation of a segmented electrode for a capacitive plasma chamber is expected to achieve non-uniformity less than about 5% when a partition shown in FIG. 1 is used, due to the smaller dimensions of the sub-electrodes. However, there are a number of issues that need to be addressed when a partitioned plasma electrode is used for a capacitively coupled plasma chamber, such as a discharge between adjacent sub-electrodes and RF interference among sub-electrodes.

There are several U.S. patents pertaining to segmented electrodes used in plasma processing. These include U.S. Pat. Nos. 4,885,074, 5,565,074 and 5,733,511. The segmented electrodes disclosed in these patents are not adjustable in position.

BRIEF SUMMARY OF THE INVENTION

The present invention pertains to electrodes, and in particular to adjustable segmented electrodes used in plasma processing of workpieces such as semiconductor wafers.

A first aspect of the invention is a segmented electrode apparatus for use in a plasma chamber having a wall. The apparatus comprises a plurality of electrode segments each having an upper surface, a lower surface and a periphery. The electrode segments are supported in place relative to the plasma chamber wall by an electrode segment support member connected to each of the electrode segments and to the chamber wall. The lower surfaces of the electrode segments define an electrode segment plane. Further included in the electrode is a plurality of displaceable insulating ring assemblies. Each assembly has an insulating body with an upper portion and a lower portion and surrounds a corresponding one of the electrode segments at the electrode segment periphery. Each insulating ring assembly is arranged adjacent another insulating ring assembly and is displaceable with respect thereto and to the corresponding electrode segment. Also included in the electrode is a first plurality of displacement actuators connected to the chamber wall and to the plurality of insulating ring assemblies at the insulating body upper portions. The displacement actuators are used to displace at least one of the insulating ring assemblies relative to the corresponding one of the electrode segments so as to cause the lower portion of at least one insulating body to move in a direction perpendicular to the electrode segment plane (e.g., toward the plasma).

A second aspect of the invention is a plasma processing system for processing a workpiece. The system comprises a plasma chamber having an interior region capable of supporting a plasma, a workpiece support for supporting the workpiece, and the segmented electrode as described above, arranged within the plasma chamber adjacent the workpiece support. The system can further include a plurality of RF power supplies connected to corresponding electrode segments, and a control system electronically connected to the plurality of RF power supplies, for controlling the RF power delivered to the plurality of electrode segments.

A third aspect of the invention is a method of processing a workpiece with a plasma formed in a process chamber from a gas enclosed therein. The plasma chamber has a segmented electrode with electrode segments that define an electrode segment plane. The electrode segments are separated by adjustable insulating ring members having an insulating body with an upper portion and a lower portion. The workpiece resides on a workpiece support adjacent the segmented electrode. The method comprising a first step of providing RF power to each of the electrode segments, thereby forming within the plasma chamber the plasma with a plasma density profile. The next step is adjusting one or more of the insulating bodies such that the lower portion of the one or more insulating bodies is translated in a direction perpendicular to the electrode segment plane, so as to adjust the plasma density profile. The last step is processing the workpiece with the plasma having the adjusted plasma density profile.

DETAILED DESCRIPTION OF THE INVENTION

The present invention pertains to electrodes, and in particular to adjustable segmented electrodes used in plasma processing of workpieces such as semiconductor wafers.

Figure 2:
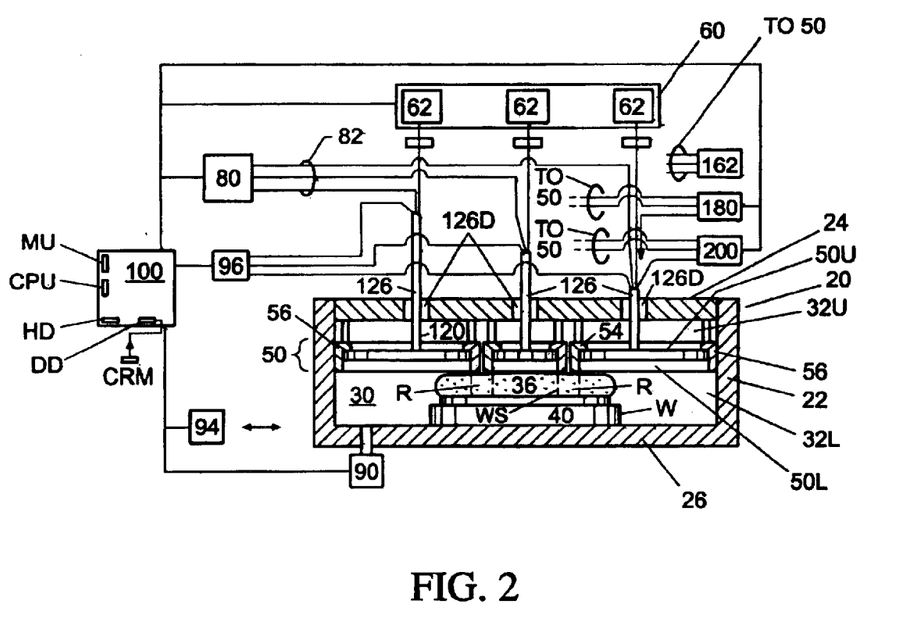
FIG. 2 is a schematic diagram of a plasma processing system according to the present invention having a segmented electrode according to the present invention.

With reference to FIG. 2, there is shown a plasma processing system comprising a plasma chamber 20 as a vacuum processing chamber adapted to perform plasma cleaning of a workpiece W, such as a silicon wafer. Workpiece W has an upper surface WS. Chamber 20 has sidewalls 22, an upper wall 24 and a lower wall 26 that enclose an interior region 30 capable of supporting a plasma 36. Chamber 20 includes within region 30 a workpiece support 40 arranged adjacent lower wall 26 for supporting workpiece W while the workpiece is processed in chamber 20. Workpiece W may be, for example, a semiconductor substrate on which patterns have been formed, where the patterns correspond to product devices at any point of the process cycle used to manufacture a semiconductor device. Workpiece W can also be a bare semiconductor substrate that needs to be plasma cleaned in preparation for processing.

Chamber 20 includes a segmented electrode 50 arranged within interior region 30 adjacent workpiece support 40. Segmented electrode 50 has an upper surface 50U facing away from workpiece support 40 and a lower surface 50L facing towards workpiece support 40. Segmented electrode 50 serves to further divide plasma chamber interior region 30 into a first section 32U between upper chamber wall 24 and upper electrode surface 50U, and a second section 32L between lower electrode surface 50L and lower chamber wall 26. Plasma 36 is formed in second section 32L of interior region 30. Plasma 36 ideally has a plasma density (i.e., number of ions/volume, along with energy/ion) that is uniform, unless the density needs to be tailored to account for other sources of process non-uniformities. The density of plasma 36 has a density profile referred to herein as a "plasma density profile."

Figure 3:
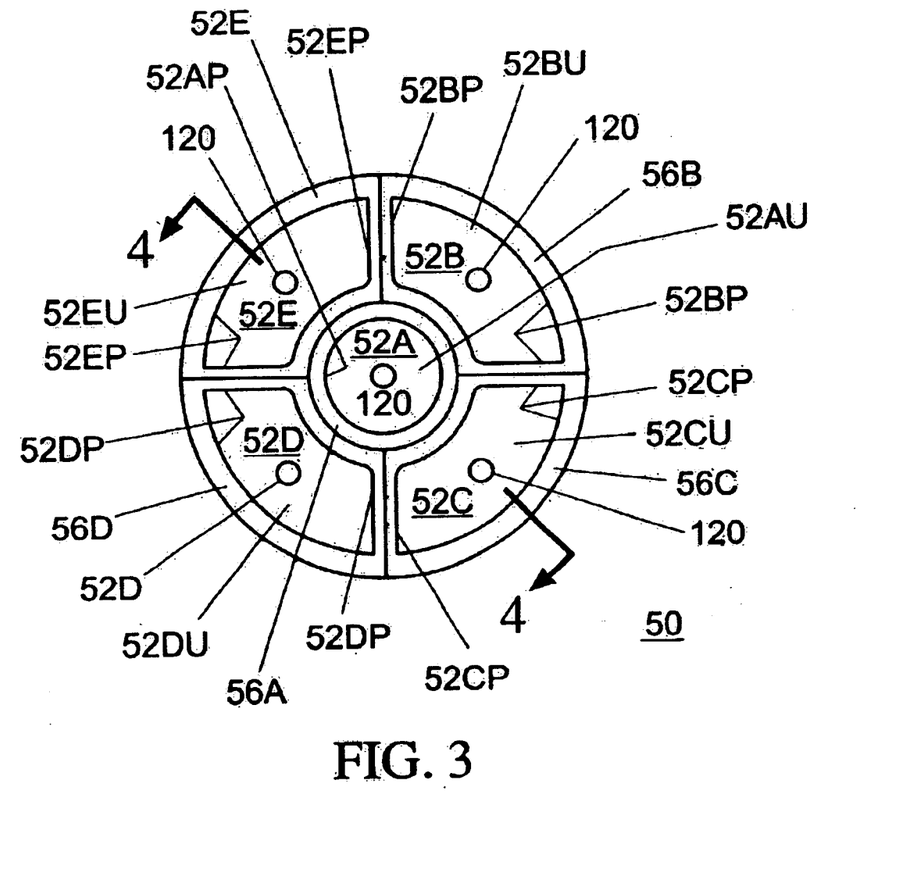
FIG. 3 is a plan view of an embodiment of the segmented electrode of the present invention.

Referring to FIG. 3 together with FIG. 2, segmented electrode 50 comprises a plurality of electrode segments 52 (e.g., 52A, 52B, . . . 52N) and an insulating structure 54 comprising a plurality of insulating ring assemblies 56 surrounding the electrode segments. Electrode segments 52 are preferably planar (i.e., plate-like). Segmented electrode 50 of the present invention is discussed in greater detail below.

Electrode segments 52 are electrically connected to respective RF power supplies 62 (e.g., 62A, 62B, . . . 62N) of an RF power supply system 60. respective RF power supplies 62 (e.g., 62A, 62B, . . . 62N). Each RF power supply 62 has an associated match network MN (e.g., MNA, MNB, . . . MNN) for controlling the amplitude and phase of the RF power delivered to a respective electrode segment 52. By adjusting the RF power amplitude and phase delivered to each electrode segment 52, the plasma density profile can be adjusted. This adjustment is preferably done to optimize the uniformity of the plasma density profile. The regions in plasma 36 that lie between workpiece support 40 and insulating ring assemblies 56 are indicated by R.

With continuing reference to FIG. 2, plasma processing system 12 further includes a gas supply system 80 in pneumatic communication with plasma-cleaning chamber 20 via one or more gas conduits 82, for supplying gas in a regulated manner to form plasma 36. Gas supply system 80 supplies such gases as chlorine, hydrogen-bromide, octafluorocyclobutane, and various other fluorocarbon compounds, and for chemical vapor deposition applications, includes silane, ammonia, tungsten-tetrachloride, titanium-tetrachloride, and the like.

The plasma processing system also includes a vacuum system 90 pneumatically connected to chamber 20 for evacuating interior region section 32L to a desired pressure [1 to 1000 mTorr]. The precise pressure depends on the nature of plasma 36 and of the desired processing operation.

Further included in the plasma processing system 12 is a workpiece handling and robotic system 94 in operative communication with chamber 20 for transporting workpieces W to and from workpiece support 40. In addition, a cooling system 96 in fluid communication with segmented electrode 50 is preferably included for flowing a cooling fluid to and from the segmented electrode.

Plasma processing system 12 further includes a main control system 100 to which RF power supply system 60, gas supply system 80, vacuum pump system 90 and workpiece handling and robotic system 94 are electronically connected. Also connected to control system 100 are the displacement actuator control units, introduced below.

In a preferred embodiment, main control system 100 is a computer having a memory unit MU having both random-access memory (RAM) and read-only memory (ROM), a central processing unit CPU (e.g., PENTIUM™ processor from Intel Corporation), and a hard disk HD, all electronically connected. Hard disk HD serves as a secondary computer-readable storage medium, and can be, for example, a hard disk drive for storing information corresponding to instructions for control system 184 to carry out the present invention, as described below. Control system 100 also preferably includes a disk drive DD, electronically connected to hard disk HD, memory unit MU and central processing unit CPU, wherein the disk drive is capable of accepting and reading (and even writing to) a computer-readable medium CRM, such as a floppy disk or compact disk (CD), on which is stored information corresponding to instructions for control system 100 to carry out the present invention. It is also preferable that main control system 100 have data acquisition and control capability. A preferred control system 100 is a computer, such as a DELL PRECISION WORKSTATION 610™, available from Dell Corporation, Dallas, Tex. Control system 100 is used for controlling the operation of system 12 in the plasma processing of a workpiece, as described below.

Adjustable Segmented Electrode

Figure 4:
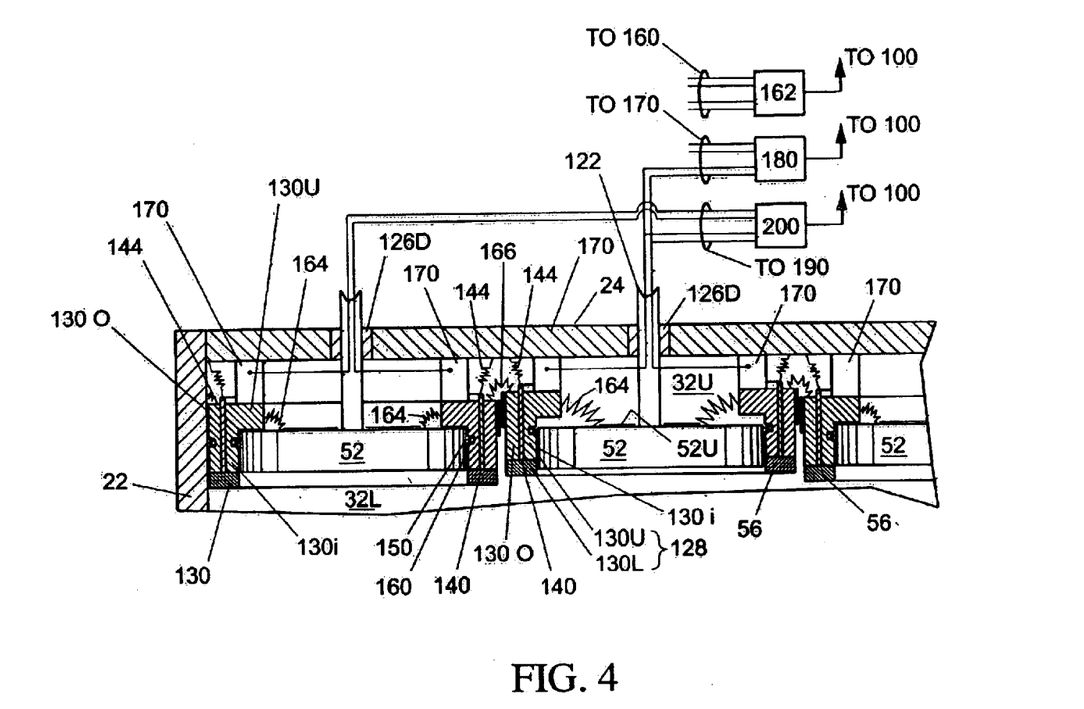
FIG. 4 is a cross-sectional diagram of the segmented electrode of FIG. 3 incorporated into the plasma chamber of the plasma processing system of FIG. 2, showing a portion of the chamber side wall and upper wall.

In FIGS. 3 and 4, segmented electrode 50 is shown to have five segments 52A–52D. Though five total electrode segments are shown for the sake of illustration, it will be apparent that two or more segments are generally possible. It will also be apparent that a segmented electrode 52 according to the present invention can have virtually any shape. In FIG. 3, Electrode segment 52A is shown as a circular central electrode with a perimeter 52AP, while segments 52B–52E are arcuate-shaped electrodes arranged around the perimeter 52AP. Electrode segments 52B–52E also each have a corresponding perimeter 52BP–52EP. Electrode segments 52A–52E also have respective upper surfaces 52AU–52EU (see FIG. 3) and corresponding lower surfaces. An exemplary segmented electrode to which the present invention can be applied is described in U.S. Provisional Patent Application No. 60/175,284, filed Jan. 10, 2000, entitled "Segmented electrode apparatus and method for plasma processing," the entire disclosure of which is incorporated by reference herein. Generally, each electrode segment 52 has a perimeter 52P, an upper surface 52U and a lower surface 52L.

Each electrode segment 52 includes a port 120 that allows for electrical connection with one of RF power supplies 62. Ports 120 also allow for pneumatic communication between chamber interior 30 and gas supply system 80 via gas conduit 82, and if necessary, fluid communication with cooling system 96 through conduits 122. The latter also serve as electrode support members for supporting electrode segments 52 within chamber interior region 30 and holding the segments fixed relative to chamber 20. Plasma chamber 20 has openings 126 in upper wall 24 through which conduits 122 extend (see FIG. 1). Each opening 126 is preferably surrounded with a dielectric insulator 126D to prevent an undesirable electrical connection forming through chamber 20, which is typically made of a conducting material.

Arranged between electrode segments 52 is insulating structure 54, mentioned above. With reference now also to FIG. 4, insulating structure 54 comprises individual insulation ring assemblies 56 (e.g., 56A–56E) surrounding each electrode perimeter 52P (e.g., 52AP–52EP).

With continuing reference to FIG. 4, each insulation ring assembly 56 comprises an insulating body 128 having an inner portion 130O adjacent the corresponding electrode segment periphery 52P (e.g., periphery 52CP of electrode segment 56C), an outer portion 130O opposite the inner portion, an upper portion 130U and a lower portion 130L. Upper portion 130U preferably is formed so as to extend over a small portion of upper surface (e.g., 52CU) of the corresponding electrode segment (e.g., 52C) near periphery 52P. In a preferred embodiment of the present invention, upper portion 130U is made of a first dielectric material and lower portion 130L made of a second dielectric material. A preferred material for upper portion 130U is quartz, while a preferred material for lower portion 130L is alumina. The material constituting lower portion 130L is preferably a material compatible with the particular plasma processing to be performed in plasma processing system 12. Upper and lower portions 130U and 130L can be formed as separate ring structures joined together to form integral insulating bodies 128.

Each insulation ring assembly 56 further includes a conducting shield 140 embedded within insulating body 128 and arranged so as to shield the corresponding electrode segment from electrical interference from adjacent electrode segments. Each shield 140 is connected to ground (here, upper chamber wall 24) via a ground wire 144. Each insulation ring assembly 56 preferably further includes a seal 150 between insulating body 128 and the corresponding electrode segment perimeter (e.g., 52CP of electrode segment 52C) the top insulation ring and the outer radius of the electrode. Each seal 150 preferably resides in a cut-out 156 in inner portion 130I of a respective insulating body 128. Seals 150 serve to isolate plasma chamber upper interior section 32U from plasma chamber lower interior section 32L. This could allow, for example, for the flow of cooling fluid over upper surfaces 52U (e.g., 52AU–52EU) of each electrode segment 52 (e.g., 52A–52E). For those electrode segments adjacent chamber sidewall 22, an additional seal 150 and corresponding cut-out 156 is provided in outer portion 130O of insulating body 128 to seal the gap between the chamber sidewall and insulating body 128.

In a preferred embodiment, each insulation ring assembly further includes a displacement actuator 160 placed adjacent seal 150 in a cut-out 156 (see FIG. 5) in upper portion 130 of insulating body 128. Displacement actuator 160 is located adjacent seal 150 so that seal 150 tightly engages the perimeter of the corresponding electrode segment 52 when the displacement actuator is activated. Displacement actuators 160 are electronically connected to a displacement actuator control unit 162, which is electronically connected to and controlled by main control system 100. Displacement actuators 160 are preferably piezoelectric transducers, though other known actuators can also be employed. Displacement actuators 160 are constructed and operated to expand in the X-direction. When contracted by a signal from control unit 162, actuators 160 cause the pressure of seal 150 against segment 52 to diminish in order to allow body 128 to be moved in the Y-direction.

Each insulation ring assembly 56 preferably further includes an inner bellows 164 attached to inner portion 130I of insulating body 128 and upper surface 52U of the corresponding electrode segment 52 so as to form a seal between each insulating body and the corresponding electrode segment.

In addition, each insulation ring assembly 56 further includes an outer bellows 166 attached to upper surfaces of upper portions 130U of adjacent insulating bodies 128. For those insulating bodies 128 adjacent chamber wall 22, outer bellows 166 are attached to upper surfaces of upper portions 130U and to the chamber sidewalls 22. Outer bellows 166 form a seal between adjacent insulating bodies 128, or between an insulation body and chamber wall 22, even when one of the insulating bodies moves relative to an adjacent insulation body or the chamber wall, as described below.

For those processes where some contamination is tolerable, the bellows can be entirely removed, in which case walls 22 and 24 serve as the primary vacuum enclosure. When bellows are used and the segmented electrode is composed of concentric rings, each bellows will be connected between two rings or between the outer ring and wall 22, as shown. However, when the upper electrode is further segmented in the azimuthal direction, as in FIGS. 1 and 3, walls 22 and 24, which can be fabricated from the same material piece, must also include ribs that outline or partition the layout of electrode segments and extend downward between plates 196. Therefore, the bellows would be attached between insulation ring assemblies and the respective wall and/or ribs surrounding the assemblies.

Figure 5:
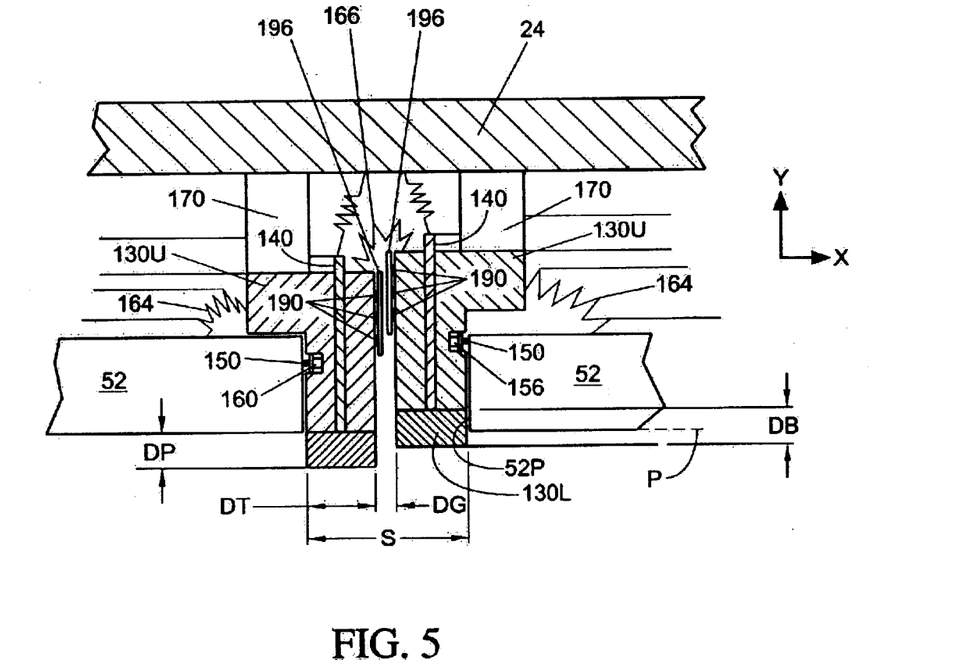
FIG. 5 is a close-up cross-sectional view of the segmented electrode shown in FIG. 4, illustrating the movement of insulation ring assemblies relative to one another.

With reference now also to FIG. 5, each insulation ring assembly 56 further includes displacement actuators 170 connected to upper chamber wall 24 and to corresponding upper portions 130U of insulating body 128. Displacement actuators 170 serve to adjust the position of insulating ring assemblies 56 in the Y-direction, or vertically. Displacement actuators 170 are electronically connected to a displacement actuator control unit 180 through conduit 122. Displacement actuator control unit 180 is also electronically connected to and controlled by main control system 100. Displacement actuators 170 are preferably piezoelectric transducers, though other known actuators can also be employed.

Further, each insulation ring assembly 56 includes displacement actuators 190 arranged on outer portion 130 of insulating body 128. Displacement actuators 190 can be embedded into insulating body 128. Each set of displacement actuators 190 carries at the side thereof remote from insulating body 128, a thin flat plate member 196 that interfaces with other plate members 196 of adjacent insulating bodies 128. Displacement actuators 190 are active in the X-direction so that adjacent plate members 196 can be made to be loosely or tightly engaged (i.e., interfaced). When loosely engaged, or not engaged, members 196 can slide over one another so that the positions of insulating bodies 128 can be adjusted (i.e., displaced in the Y-direction). FIG. 5 shows a state in which plates 196 are not engaged. When members 196 are tightly engaged, i.e. pressed against one another, seals 150 on the opposite side of the respective insulating bodies are pressed between the respective electrode segment and the electrode body to form a tight seal. In other words, displacement actuators 190 control the degree of engagement between adjacent insulating ring assemblies for the purposes of varying the relative displacement of the assemblies.

Displacement actuators 190 are electronically connected to a displacement actuator control unit 200 through conduit 122. Displacement actuator control unit 200 is also electronically connected to and controlled by main control system 100. Displacement actuators 170 are preferably piezoelectric transducers, though other known actuators can also be employed.

With continuing reference to FIG. 5, several key parameters associated with the present invention are now discussed. The distance that lower portion 130L of insulation ring assembly 128 protrudes into section 32L of interior 30 is given by DP. This parameter is a measure of how far beyond an electrode segment plane P (defined by lower surfaces 52L of electrode segments 52) lower portion 130L of insulating body 128 extends. The overall spacing between electrode segments 52 is S. The width of each insulating body 128 as measured across the portion of the insulating body between adjacent electrode segments (i.e., in the X-direction) is DT. When lower portion 130L is made of a dielectric material different from upper portion 130U, the thickness of the lower portion (measured in the Y-direction) is DB. In a preferred embodiment, the values for DB and DT are the same for all of the electrode segments, but in general this need not be the case. The gap between adjacent electrode segments is denoted by DG. Thus, S~DG+2DT, in the case where DT is the same for each insulating ring assembly 56.

Where upper portion 130U and lower portion 130L are made of different materials, the upper portion provides electrical insulation between adjacent electrode segments 52. Further, conducting shield 140 preferably resides in upper portion 130U and does not extend into lower portion 130L. Selection of the material for lower portion 130L and its corresponding dimensions are chosen such that electrical insulation from adjacent electrodes is preserved. However, the material should allow for segmented electrode 50 to match the impedance of the RF power being fed to electrode segments 52. Thus, the materials used for upper portion 130U and lower portion 130L could be the same, depending on the design requirements of the particular system 12. In addition, the material should be compatible with the plasma process to be carried out. In some cases, it can be necessary to relax the necessity of trying to impedance match with plasma 36. If the material used for lower portion 130 is not compatible with the plasma processing to be carried out, then the value of DP should be less than DB to prevent contamination.

The parameters DT, DG and DP are design parameters, since they are designed into segmented electrode 50 and cannot be readily changed. The value of DG should be as small as possible, but not so small as to restrict the relative motion between the adjacent insulating bodies 128. Typical ranges for the above-described parameters are 0<DP<8 mm, 2<DT<10 mm, and 1<DB<10 mm. DP can have a value of 0 because the lower surface of each lower portion 130L can be flush with the lower surface of the adjacent electrode 52. Like many semiconductor processing techniques, the optimum parameter values can best be determined empirically by performing experiments that take into account the RF power levels, the gases used to form the plasma, the impedance match between the RF power feed and the electrode segments, the particular process to be performed, and the like. Empirical data can also be stored in control system 100 in memory unit MU as a database for setting the control parameters.

FIGS. 4 and 5 show one insulation ring assembly 56 displaced relative to another. Note that electrode segments 52 do not move, but rather only one or more of insulating ring assemblies 56 are translated in the Y-direction via the activation of displacement actuators 170, thereby introducing of a small portion of insulating ring assembly 56 (i.e., lower portion 130L of insulating body 128) below plane P. The presence of this extra dielectric material changes the dielectric constant in regions R. As noted above in the "Background of the Invention" section, the plasma can have slight variations in plasma density in these regions due to the presence of the insulating structure between the electrode segments. This translates into non-uniform etching or deposition when processing a workpiece. By slightly changing the position of insulating rings, thus the equivalent dielectric constant in this manner, the slight variations (up to about 8%) in plasma density can be smoothed out. This, in turn, results in more uniform processing of the workpiece.

Method of Adjusting Segmented Electrode

With continuing reference to FIGS. 4 and 5, if one insulating ring assembly 56 needs to be adjusted, then displacement actuators 160 and 190 are activated by first and second electronic signals, respectively, from displacement actuator control units 162 and 200, respectively. This causes displacement actuators 160 and 190 to contract inwardly in the X-direction, leaving plate members 196 of adjacent insulating bodies loosely engaged so that one plate member can slide past another in the Y-direction. Then, a third electronic signal from displacement actuator control unit 180 activates displacement actuators 170 to expand or contract along the Y-direction to place insulating ring assembly 56 in a desired vertical position. Once so positioned, displacement actuator control units 162 and 200 send fourth and fifth electronic signals to displacement actuators 162 and 190, respectively, to expand outwardly in the X-direction. This causes seals 150 to tightly engage electrode segment perimeters 52P, and causes plate members 196 of adjacent insulating ring assemblies 56 to tightly engage one another.

Method of Operating Plasma Processing System

With reference now to FIG. 1, a method of operating plasma processing system 12 according to the present invention is now described. First, a predetermined set of instructions (e.g., a computer program) is loaded (e.g., via computer readable medium CRM and disk drive DD) and stored in main control system 100 in memory unit MU or on hard drive HD. The instructions include steps for implementing a user-defined recipe for plasma processing of workpiece W. Next, control system 100 sends an electronic signal to workpiece handling and robotics system 94 to initiate the loading and unloading of workpiece W to and from workpiece support 40. Control system 100 then sends an electronic signal to gas supply system 80 to initiate purging of plasma chamber 20 with a purge gas (e.g., nitrogen) supplied by gas supply system 80. Next, control system 100 sends another electronic signal to vacuum system 90 to maintain a predetermined pressure in plasma chamber 20. Typical operating pressures in chamber 20 range from 1 to 100 mTorr, but can also significantly deviate from this range, depending on the plasma process.

In the next step of the operation, control system 100 sends another electronic signal to gas supply system 80 to regulate the flow of gases from which plasma 36 can be formed, such as those gases mentioned above, from the gas supply system to plasma chamber 20. Next, control system 100 sends another electronic signal to RF power supply system 60, which provides RF power to electrode segments 52 via corresponding RF power supplies 62 and match networks MN. This results in the formation of plasma 36 within interior section 32L of plasma chamber 20. The preferred frequency for RF power supply system 60 driving electrode segments 52 is preferably in the megahertz range.

In the next step of the operation, control system 100 sends electronic signals to actuator control units 162, 180 and 200 to adjust the position of one or more of insulating ring assemblies 56 in the manner described above to change the plasma density profile of plasma 36 to match, or at least approach, a desired plasma density profile. The desired plasma density profile can be a uniform profile, or a non-uniform profile that provides a particular plasma processing characteristic, for example etch or deposition characteristic. The desired profile can be predetermined as an idealized one, or can be chosen from one of the plasma density profiles available based on the available operating conditions using information stored in memory unit MU of control system 100.

In arriving at forming a plasma density profile that approaches or matches a desired plasma density profile, it can be preferred, or even necessary, to process a test substrate, or multiple substrates. This data can be compared to data stored in memory unit MU pertaining to a variety of possible plasma states, and can be used to determine the state of plasma 36. This then provides direction as to setting the operating parameters of system 12, including the design parameters DB, DG and DT, and control variable DP so that this measured plasma density profile is altered to match or approach a desired plasma density profile. In this case, after the test substrate or substrates are processed and evaluated, the above steps are repeated in processing the substrate to be processed with the newly formed plasma density profile.

In the meantime, control system 100 sends another electronic signal to cooling system 96 so that the flow of cooling fluid to segmented electrode 50 is adjusted to maintain electrode segments 52 at a controlled temperature during operation when processing workpiece W. This step is optional and may not be required for certain plasma processes.

When plasma processing of workpiece W is complete, control system 100 sends another electronic signal to vacuum system 90, which adjusts the pressure of interior region 30 of chamber 20 to a setting where unloading of workpiece W can be performed. Finally, control system 100 sends an electronic signal to workpiece handling and robotics system 94, which removes workpiece W from reactor chamber 20.

In further accordance with the invention, a segmented electrode apparatus could include both the movable insulating ring assemblies, as described above, and movable electrode segments, as disclosed in co-pending Provisional U.S. application Ser. No. 60/175,284, filed Jan. 10, 2000, the entire disclosure of which is incorporated herein by reference.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Moreover, the method and apparatus of the present invention, like related apparatus and methods used in the semiconductor arts that are complex in nature, are often best practiced by empirically determining the appropriate values of the operating parameters, or by conducting computer simulations to arrive at best design for a given application. Accordingly, all suitable modifications and equivalents should be considered as falling within the spirit and scope of the invention.

What is claimed is:

1. A segmented electrode apparatus for use in a plasma chamber having a wall, comprising:
   a) a plurality of electrode segments lying generally in an electrode segment plane;
   b) a plurality of displaceable insulating ring assemblies, each having an insulating body and surrounding a corresponding one of said electrode segments wherein each of said insulating ring assemblies is arranged adjacent another said insulating ring assembly and is displaceable with respect thereto and to said electrode segments; and
   c) a first plurality of displacement actuators connected to said plurality of insulating ring assemblies for displacing at least one of said insulating ring assemblies relative to said corresponding one of said electrode segments so as to cause said at least one insulating ring assembly to move in a direction perpendicular to the electrode segment plane.

2. An apparatus according to claim 1, wherein each insulating ring assembly has a grounded conducting shield member within said insulating body.

3. An apparatus according to claim 1, wherein said insulating body of each said ring assembly has an upper portion made of a first insulating material and a lower portion made of a second insulating material.

4. An apparatus according to claim 3, wherein said first insulating material is quartz or ceramic.

5. An apparatus according to claim 3, wherein said second insulating material is alumina or silicon.

6. An apparatus according to claim 1, wherein each of said electrode segments includes a port for connecting said electrode segment to a corresponding RF power supply.

7. An apparatus according to claim 6, further including a plurality of RF power supplies each connected to a respective electrode segment at a respective port.

8. An apparatus according to claim 1, further including a first displacement actuator control unit electronically connected to said first plurality of displacement actuators, for controlling said first plurality of displacement actuators.

9. An apparatus according to claim 1, wherein each said insulating body includes an inner portion and an outer portion, the apparatus further including on each said insulating body:
 a) a second displacement actuator having a first end and a second end, said first end being attached to said insulating body outer portion; and
 b) a plate member attached to said second end,
  wherein each of said plate members interfaces with said plate member of an adjacent insulating body.

10. An apparatus according to claim 9, further including a second displacement actuator control unit electronically connected to said second displacement actuators.

11. An apparatus according to claim 9, wherein: said inner portion of each of said insulating bodies is provided with a cut-out; and said apparatus further comprises:
 a third plurality of displacement actuators arranged within each of said cut-outs; and
 a seal placed within each of said cut-outs adjacent said third plurality of actuators and arranged so as to form an adjustable seal between said inner portion of said insulating body and said corresponding electrode segment.

12. An apparatus according to claim 1, further including a plurality of inner bellows corresponding to said plurality of electrode segments, each of said inner bellows being attached to a corresponding electrode to said insulating body, so as to form an adjustable seal between said electrode segment and said insulating ring assembly that can accommodate displacement of said insulating ring assembly relative to an adjacent said electrode segment.

13. An apparatus according to claim 12, further including a plurality of outer bellows, with each outer bellows being attached to adjacent insulating bodies so as to form an adjustable seal between adjacent insulating ring assemblies that can accommodate relative displacement of said adjacent isolating ring assemblies.

14. A plasma processing system for processing a workpiece, comprising:
 a) a plasma chamber having an interior region capable of supporting a plasma;
 b) a workpiece support for supporting the workpiece; and
 c) a segmented electrode apparatus according to claim 1, arranged within said plasma chamber adjacent said workpiece support.

15. A system according to claim 14, further comprising:
 d) a plurality of RF power supplies connected to corresponding electrode segments; and
 e) a control system electronically connected to said plurality of RF power supplies, for controlling the RF power delivered to said plurality of electrode segments.

16. A system according to claim 15, further including:
 f) a first displacement actuator control unit electrically connected to said first plurality of displacement actuators and said control system, for controlling the displacement of said insulating ring assemblies.

17. A system according to claim 16, wherein each said insulating body has an inner portion and an outer portion, the system further including, for said insulating ring assembly:
 g) a second plurality of displacement actuators having first ends attached to said insulating body outer portion, and second ends opposite said first end that interface with an adjacent one of said insulating bodies;
 h) a second displacement actuator control unit electronically connected to each of said second plurality of displacement actuators and said control system, for controlling the degree of engagement between adjacent insulating ring assemblies.

18. A system according to claim 17, further including a plurality of plate members, each attached to a respective one of said second ends, wherein each of said plate members interfaces with another of said plate members.

19. A system according to claim 16, further including a gas supply system pneumatically connected to said plasma chamber and electronically connected to said control system, for providing gas to said interior region of said plasma chamber.

20. A system according to claim 19, further including a workpiece handling and robotics system in operative communication with said plasma chamber and said workpiece support, and in electronic communication with said control system, for transporting workpieces to and from said chamber.

21. A system according to claim 15, wherein said control system includes:
 a) a central processing unit;
 b) a memory unit electronically connected to said memory unit;
 c) a hard drive electronically connected to said memory unit and said central processing unit;
 d) a disk drive electronically connected to said memory unit, said hard drive, and said central processing unit, and capable of accepting and reading a computer-readable medium.

22. A method of adjusting the plasma density of a plasma formed in a plasma chamber using a segmented electrode having a plurality of electrode segments that define an electrode segment plane, and a plurality of adjustable insulating ring assemblies each surrounding a respective electrode segment, the insulating ring assemblies each having an insulating body comprising an upper portion and a lower portion, said method comprising the steps of:
 a) measuring a variation in the plasma density uniformity in at least one region of the plasma adjacent the insulating ring assemblies; and
 b) displacing at least one or more of the adjustable ring assemblies in a direction perpendicular to the electrode segment plane.

23. A method according to claim 22, wherein in said step a), lower portions of said ring assemblies are substantially aligned with the electrode segment plane, and in said step b), said displacement is toward the plasma.

24. A method according to claim 23, further including the step, after said step b), of once again measuring a variation in the plasma density uniformity in said at least one region of the plasma adjacent the insulating ring assemblies.

25. A method according to claim 22, wherein said step a) involves plasma etching a workpiece.

26. A method according to claim 22, further including the step, prior to said step a), of forming said lower portions of said ring assemblies of a material that is different from that of upper portions of said ring assemblies.

27. A method of processing a workpiece with a plasma formed in a process chamber from a gas enclosed therein, the plasma chamber having a segmented electrode with electrode segments that define an electrode segment plane, the electrode segments separated by adjustable insulating ring members having an insulating body with an upper portion and a lower portion, the workpiece residing on a workpiece support adjacent the segmented electrode, the method comprising the steps of:

a) providing RF power to each of the electrode segments, thereby forming within the plasma chamber the plasma with a plasma density profile;

b) adjusting, at least one of the insulating bodies such that the lower portion of the one or more insulating bodies is translated in a direction perpendicular to the electrode segment plane, so as to adjust the plasma density profile; and c) processing the workpiece with the plasma having the adjusted plasma density profile.

28. A method according to claim 27, wherein said step a) includes adjusting at least one of amplitude and phase of the RF power supplied to each electrode to optimize the uniformity of the plasma density profile.

29. A method according to claim 27, wherein said step b) includes the steps of arranging the insulating body lower portions to be co-planar with the electrode segment plane, and then translating the at least one insulating body such that the lower portion of the at least one insulating body is translated toward the plasma.

30. A method according to claim 27, further including the step of measuring the adjusted plasma density profile by measuring the workpiece processed in said step c).

* * * * *